United States Patent
Moore et al.

(10) Patent No.: US 11,916,138 B2
(45) Date of Patent: Feb. 27, 2024

(54) ETCH STOP LAYER FOR INJECTING CARRIERS INTO DRIFT LAYER FOR A VERTICAL POWER DEVICE

(71) Applicant: Pakal Technologies, Inc., San Francisco, CA (US)

(72) Inventors: Paul M Moore, Hillsboro, OR (US); Vladimir Rodov, Seattle, WA (US); Richard A Blanchard, Los Altos, CA (US)

(73) Assignee: PAKAL TECHNOLOGIES, INC, San Francisco, CA (US)

( * ) Notice: Subject to any disclaimer, the term of this patent is extended or adjusted under 35 U.S.C. 154(b) by 0 days.

(21) Appl. No.: 17/725,326

(22) Filed: Apr. 20, 2022

(65) Prior Publication Data

US 2022/0344498 A1    Oct. 27, 2022

Related U.S. Application Data

(60) Provisional application No. 63/178,198, filed on Apr. 22, 2021.

(51) Int. Cl.
| | | |
|---|---|---|
| *H01L 29/745* | (2006.01) | |
| *H01L 29/66* | (2006.01) | |
| *H01L 29/74* | (2006.01) | |

(52) U.S. Cl.
CPC .... *H01L 29/7455* (2013.01); *H01L 29/66363* (2013.01); *H01L 29/7424* (2013.01)

(58) Field of Classification Search
None
See application file for complete search history.

(56) References Cited

U.S. PATENT DOCUMENTS

| | | | |
|---|---|---|---|
| 6,521,041 B2 | 2/2003 | Wu | |
| 11,114,552 B2 | 9/2021 | Moore | |
| 2012/0196414 A1* | 8/2012 | Ngai | H01L 21/6835 |
| | | | 257/E21.403 |
| 2013/0278372 A1* | 10/2013 | Stecher | H01L 23/5227 |
| | | | 336/200 |

(Continued)

OTHER PUBLICATIONS

Tuning of Etching Rate by Implantation: Silicon, Polysilicon, and Oxide. Remy Charavel et al. 2006 American Inst. of Physics.

(Continued)

*Primary Examiner* — Khaja Ahmad
(74) *Attorney, Agent, or Firm* — Patent Law Group; Brian Ogonowsky

(57) ABSTRACT

A sacrificial substrate wafer is provided. A low resistivity etch stop layer is formed on or in the top surface of the wafer. The etch stop layer may be a highly doped, p+ type epitaxially grown layer, or an implanted p+ type boron layer, or an epitaxially grown p+ type SiGe layer. Various epitaxial layers, such as an n− type drift layer, and doped regions are then formed over the etch stop layer to form a vertical power device. The starting wafer is then removed by a combination of mechanical grinding/polishing to leave a thinner layer of the starting wafer. A chemical or plasma etch is then used to remove the remainder of the starting wafer, using the etch stop layer to automatically stop the etching. A bottom metal electrode is then formed on the etch stop layer. The etch stop layer injects hole carriers into the drift layer.

12 Claims, 5 Drawing Sheets

(56) References Cited

U.S. PATENT DOCUMENTS

2015/0311325 A1* 10/2015 Zhang .................. H01L 29/0619
                                                                257/77
2015/0349104 A1* 12/2015 Rodov ................ H01L 29/0839
                                                                257/133
2017/0110535 A1*  4/2017 Yilmaz ............... H01L 29/7813

OTHER PUBLICATIONS

Etch Rates for Micromachining Processing. Kirt R. Williams. Journal of Microelectromechanical Systems, vol. 5, No. 4, Dec. 1996.

* cited by examiner

ETCH STOP LAYER FOR INJECTING CARRIERS INTO DRIFT LAYER FOR A VERTICAL POWER DEVICE

CROSS-REFERENCE TO RELATED APPLICATIONS

This application is based on provisional application Ser. No. 63/178,198, filed Apr. 22, 2021, by Paul M. Moore et al., assigned to the present assignee and incorporated herein by reference.

FIELD OF THE INVENTION

This invention relates to forming vertical power devices having a thin, low resistivity p+ type bottom semiconductor layer, having a metal electrode formed on it, for carrier injection and, in particular, relates to a method for using an etch stop layer as the low resistivity bottom semiconductor layer for reducing forward voltage drop across the device.

BACKGROUND

Applicant's U.S. Pat. No. 11,114,552, incorporated herein by reference, discloses a vertical insulated gate turn-off (IGTO) device which will be used as an example of one of many types of vertical power switch devices that can benefit from the present invention. The IGTO device from U.S. Pat. No. 11,114,552 will be described in detail, and the invention will later be described as a modification to such a device and related power devices.

Prior art FIG. 1 is a cross-sectional view of a small portion of a vertical IGTO device 10 described in U.S. Pat. No. 11,114,552 that can benefit from the present invention. A full understanding of the structure of FIG. 1 is not essential to understanding the present invention, since the present invention primarily concerns the bottom layers of the device. FIG. 1 just shows an edge portion of the cellular IGTO device 10, and the structure contains a central active cellular array surrounded by a termination portion.

A plurality of cells are shown having vertical gates 12 (e.g., doped polysilicon) formed in insulated trenches. A 2-dimensional array of the cells, forming a rectangular mesh, may be formed in a common, lightly-doped p− well 14, and the cells are connected in parallel.

N+ regions 18 surround the gates 12 and are contacted by a top, metal cathode electrode 20. The n+ regions 18 may be formed by implantation or by other known dopant introduction methods. At various areas 16, an n+ region 18 is opened to cause the cathode electrode 20 to "weakly" short the various n+ regions 18 to the p− well 14. Such shorting weakly biases the p− well 14 to allow the n+ regions 18 to be at the cathode voltage while there is a voltage drop across the p− well 14 when current flows through the p− well 14. Such a voltage drop, if sufficiently high, forward biases the npn transistor's base-emitter junction to turn on the IGTO device 10.

The vertical gates 12 are insulated from the p− well 14 by an oxide layer 22. The gates 12 are connected together outside the plane of the drawing and are coupled to a gate voltage via a metal gate electrode 25 directly contacting the polysilicon portion 28. A patterned dielectric layer 26 insulates the gate electrode 25 from the p− well 14 and insulates the gates 12 from the cathode electrode 20. The guard rings 29 at the edge of the cell, and at the edge of the die, reduce field crowding for increasing the breakdown voltage.

A vertical npnp semiconductor layered structure is formed. There is a bipolar pnp transistor formed by a p+ substrate 30, an epitaxially grown n− drift layer 32, and the p− well 14. There is also a bipolar npn transistor formed by the n+ regions 18, the p− well 14, and the n− drift layer 32. An n− type buffer layer 35, with a dopant concentration higher than that of the n− drift layer 32, reduces the injection of holes into the n− drift layer 32 from the p+ substrate 30 when the device is conducting. A bottom anode electrode 36 contacts the substrate 30, and a top cathode electrode 20 contacts the n+ regions 18 and contacts the p− well 14 at selected locations. The p− well 14 surrounds the gate structure, and the n− drift layer 32 extends to the surface around the p− well 14.

When the anode electrode 36 is forward biased with respect to the cathode electrode 20, but without a sufficiently positive gate bias, there is no current flow, since there is a reverse biased vertical pn junction and the product of the betas (gains) of the pnp and npn transistors is less than one (i.e., there is no regeneration activity).

When the gate 12 is sufficiently biased with a positive voltage (relative to the n+ regions 18), such as 2-5 volts, an inversion layer is formed around the gate 12, and electrons from the n+ regions 18 become the majority carriers along the gate sidewalls and below the bottom of the trenches in the inversion layer, causing the effective width of the npn base (the portion of the p− well 14 between the n− layers) to be reduced. As a result, the beta of the npn transistor increases to cause the product of the betas to exceed one. This condition results in "breakover," when holes are injected into the lightly doped n− drift layer 32 and electrons are injected into the p− well 14 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 25 being shorted to the cathode electrode 20, or taken negative, the IGTO device 10 turns off, since the effective base width of the npn transistor is increased.

The device 10 is intended to be used as a high voltage, high current switch with low voltage drop. The maximum voltage for proper operation is specified in a data sheet for the device 10.

The n− drift layer 32 is thick and has an inherent high resistivity. The n− drift layer 32 depletes during the off state, such as to withstand a potential differential of over 500 volts, and conducts during the on state when holes are injected into the n− drift layer 32 from the p+ substrate 30 (acting as an emitter).

One issue with forming the power device of FIG. 1 and other vertical power devices is that the current may be very high, such as over 10 amps, causing an undesirable voltage drop across the layers. The p+ substrate 30 incurs a significant voltage drop since it is thick. The p+ substrate 30 may be ground down mechanically, but the tolerances in the grinding method are fairly high, so p+ substrate 30 must remain fairly thick. Due to the tolerances of the grinding process, in conjunction with the variability of the epitaxial layer, the final thickness of the p+ substrate 30 cannot be predicted from lot-to-lot. Therefore, the voltage drops across the devices, as well as other device characteristics, vary somewhat from lot-to-lot.

What is needed is a modification to the device of FIG. 1, and related vertical power devices, so that there is a minimum voltage drop across the device, and the operating parameters are highly repeatable from lot-to-lot.

SUMMARY

In one embodiment, the present invention entails modifications to the Applicant's previous IGTO devices, and related vertical power devices, to provide a thinner p+ type bottom semiconductor layer that injects carriers into an overlying drift layer. This thinner layer reduces voltage drop and is repeatable from lot-to-lot.

A sacrificial substrate wafer is provided. The wafer may be p or n type silicon or may be undoped silicon, since it is mainly for forming overlying epitaxial layers and providing mechanical support and will later be completely removed. A low resistivity p+ type etch stop layer is formed on or in the top surface of the wafer. The etch stop layer may be a highly doped boron layer.

The etch stop layer may be epitaxially grown over the wafer to a very repeatable thickness. In another embodiment, the boron layer is an implanted layer.

In another embodiment, a p+ doped layer of SiGe (silicon-germanium) is formed by epitaxially growing the layer. A boron-containing gas is introduced into the reaction chamber as the SiGe layer is grown.

Various epitaxial layers and doped regions are then formed over the etch stop layer, such as described in Applicant's U.S. Pat. No. 11,114,552 (see FIG. 1). Near the end of the fabrication process, the wafer is partially removed by mechanical grinding/polishing to leave a much thinner wafer. A wet chemical or plasma etch is then used to remove the remainder of the wafer, using the etch stop layer to automatically stop the etching. An etch stop layer can reduce the etch rate by up to 200 times.

Increasing the boron concentration from about $1\times10E18$ to $2\times10E20$ cm$^{-3}$ reduces the etch rate of a silicon layer in a TMAH solution by a factor greater than 20; however, a boron concentration greater than $1\times10E19$ cm$^{-3}$ is sufficient to adequately reduce the etch rate. Similarly, p+ type SiGe has a much lower etch rate than silicon and provides a good crystalline surface for epitaxially growing the n– drift layer.

After the wafer has been completely removed (except for the etch stop layer), the bottom layer of the device is the low resistivity, p+ etch stop layer, which is very thin (e.g., a few microns) and repeatable from lot-to-lot. The etch stop layer injects hole carriers into the drift layer when the device is on.

A "bottom" metal electrode is then formed over the etch stop layer to complete the device fabrication.

The inventive etch stop layer provides synergy since it is an improved bottom semiconductor layer (thin and repeatable) for the vertical device and also performs an etch stop function.

Other techniques are described.

BRIEF DESCRIPTION OF THE DRAWINGS

FIG. 6 is used as the growth substrate for forming the overlying layers and regions.

Elements that are the same or equivalent are labeled with the same numbers.

DETAILED DESCRIPTION

Figure 2:
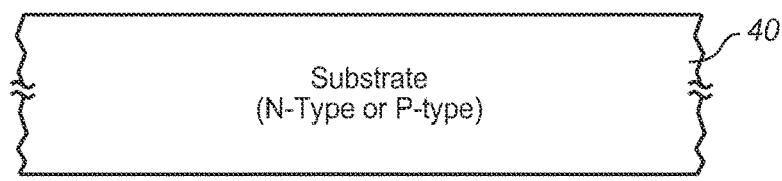
FIG. 2 is a cross-sectional view of a starting silicon substrate wafer, in accordance with one embodiment of the invention.

FIG. 2 is a cross-sectional view of a starting silicon substrate wafer 40, in accordance with one embodiment of the invention. The wafer 40 may be n– type, p– type, or undoped, since it will eventually be completely removed. Such wafers may be on the order of a few hundred microns, and up to 1000 microns, in thickness. The wafer 40 is for epitaxial growth and mechanical support during the fabrication process for forming a vertical power device. After the wafer is removed, a bottom, low resistivity p+ type semiconductor layer injects carriers into an overlying n– type drift layer when the device is turned on. The invention results in the bottom semiconductor layer being very thin and very low resistivity for a lower voltage drop when conducting large currents.

Figure 3:
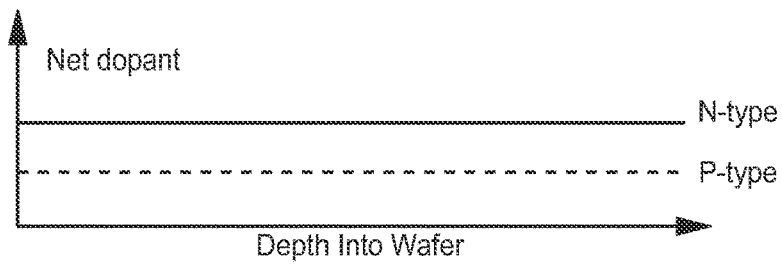
FIG. 3 is a graph of net dopant density vs. depth into the wafer of FIG. 2.

FIG. 3 is a graph of net dopant density vs. depth into the wafer 40, showing that the dopant density is uniform throughout the wafer 40. An undoped wafer 40 may also be used. If the wafer 40 is p– type, it should have a dopant concentration less than $1\times10E18$ cm$^{-3}$.

Figure 4:
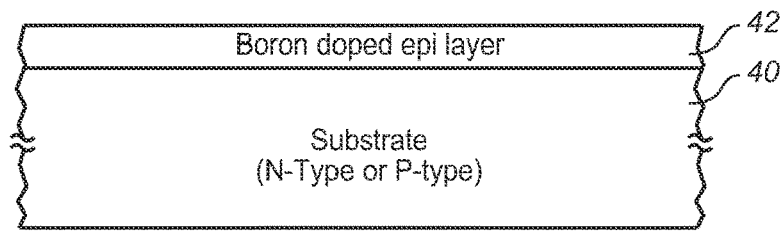
FIG. 4 illustrates the wafer having formed on its top surface a boron-doped layer by epitaxial growth, forming a p+ layer, which also serves as an etch stop layer.

FIG. 4 illustrates the wafer 40 after it has formed on its top surface a boron-doped layer by epitaxial growth, forming a very low resistance p+ layer, which also serves as an etch stop layer 42. The dopant concentration of the etch stop layer 42 should be at least $1\times10E19$ cm$^{-3}$. Boron gas is injected into a reactor while growing the silicon epitaxial layer. Alternatively, the etch stop layer 42 may be a boron-dope silicon germanium (SiGe) epitaxial layer. The etch stop layer 42 may be a few microns thick. Its thickness is not critical, but a thinner etch stop layer 42 will reduce the voltage drop when conducting high currents. The thickness of the etch stop layer 42 is very repeatable since epitaxial growth thickness is very controllable.

It is known that certain chemical etchants, such as KOH (potassium hydroxide) and TMAH (tetramethyl ammonium hydroxide), experience a large reduction in silicon etching rate when the p– type dopant density (if any) of silicon goes from less than $1\times10E18$ cm$^{-3}$ to above $1\times10E19$ cm$^{-3}$. The etch rate of silicon can be reduced 20-200 times at the etch stop layer 42. Accordingly, the dopant density in the wafer 40 must be n– type, undoped, or have a low p– type dopant density (less than $1\times10E18$ cm$^{-3}$). The wafer may have at least its bottom exposed surface subjected to the KOH or TMAH solution, such as in a bath.

If the etch stop layer 42 is p+ type SiGe, the SiGe inherently etches slower than silicon, so the dopant concentration is not as important for the reduction in etch rate. A high p– type dopant concentration is still important for low resistivity and should be above $1\times10E19$ cm$^{-3}$.

Figure 5:
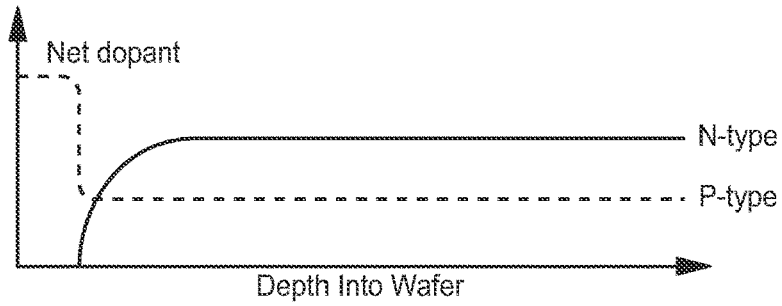
FIG. 5 is a graph showing the net dopant density vs. depth into the structure of FIG. 4.

FIG. 5 is a graph showing the net dopant density vs. depth into the structure of FIG. 4, where the dopant density of the boron in the etch stop layer 42 at the top is greater than $1\times10E19$ cm$^{-3}$ and the p− type dopant density in the wafer 40 is less than $1\times10E18$ cm$^{-3}$ (or the wafer 40 is n− type or undoped).

Figure 6:
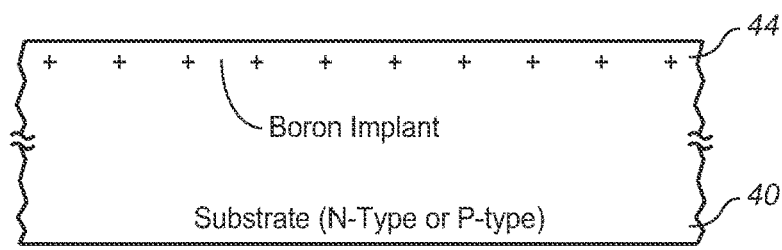
FIG. 6 illustrates another embodiment of the invention where the wafer of FIG. 2 has boron ions implanted in its top surface and ultimately driven in to form a top p+ layer, which also serves as an etch stop layer.

FIG. 6 illustrates another embodiment of the invention where the wafer 40 of FIG. 2 has boron ions implanted in its top surface and ultimately driven in to form a top p+ layer, which also serves as an etch stop layer 44. After the dopants are driven in, the etch stop layer 44 has the same properties as the etch stop layer 42 in FIG. 4.

Figure 7:
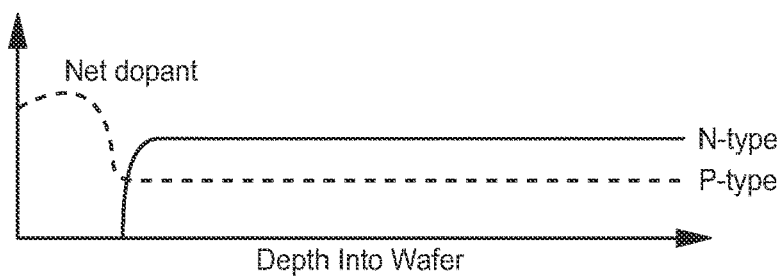
FIG. 7 is a graph showing the net dopant density vs. depth into the wafer of FIG. 6.

FIG. 7 is a graph showing the net dopant density vs. depth into the wafer 40 of FIG. 6. Since the thickness of the etch stop layer 44 depends on the depth of ion implantation and the drive-in step, the etch stop layer 44 may be thicker or thinner than the etch stop layer 42 formed using epitaxial growth. The thickness, however, is highly repeatable, resulting in the device parameters being the same from lot-to-lot.

Figure 1:
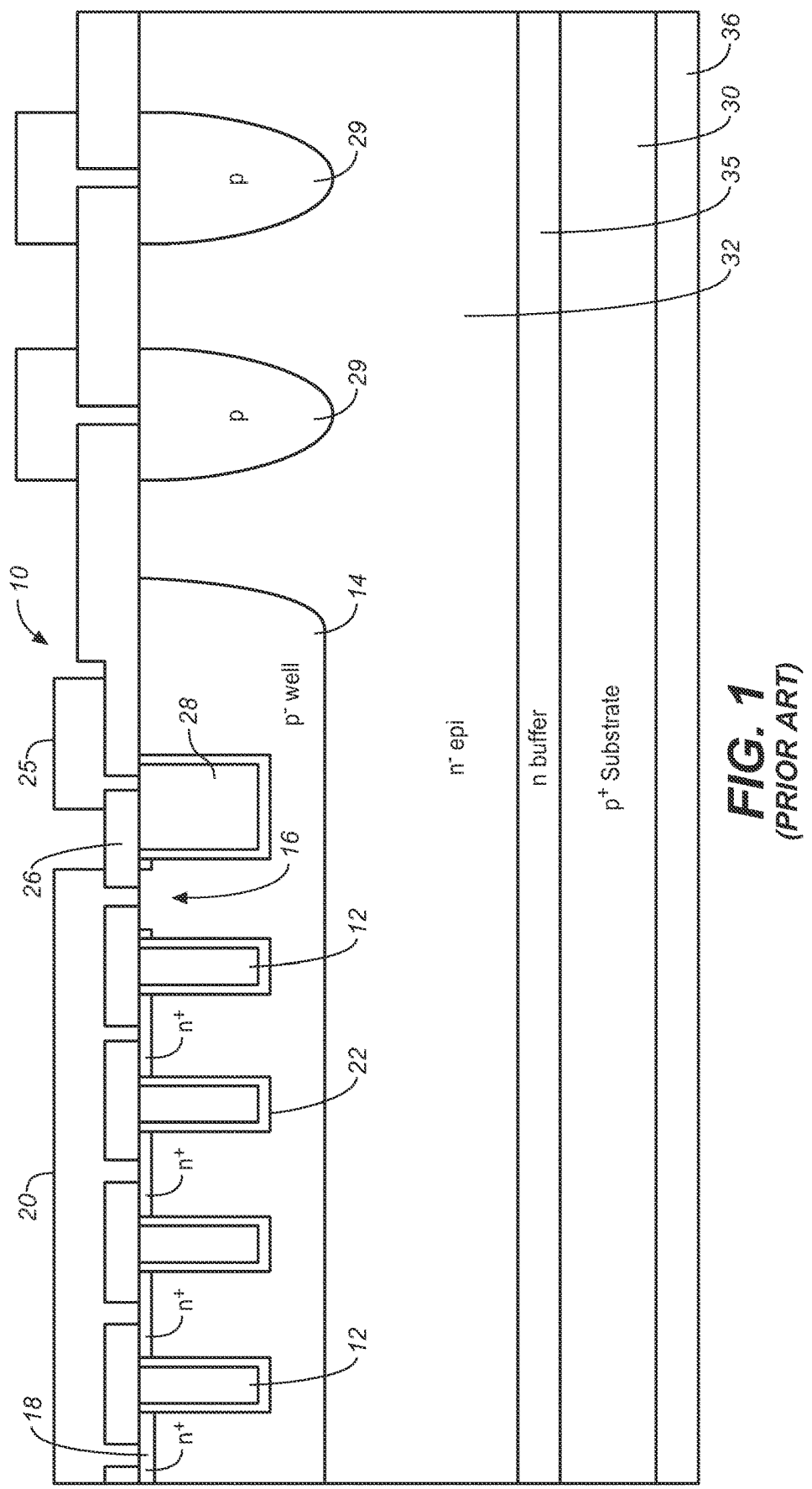
FIG. 1 is a cross-sectional view of a portion of a prior art IGTO device of the Applicant's own design.
Figure 8:
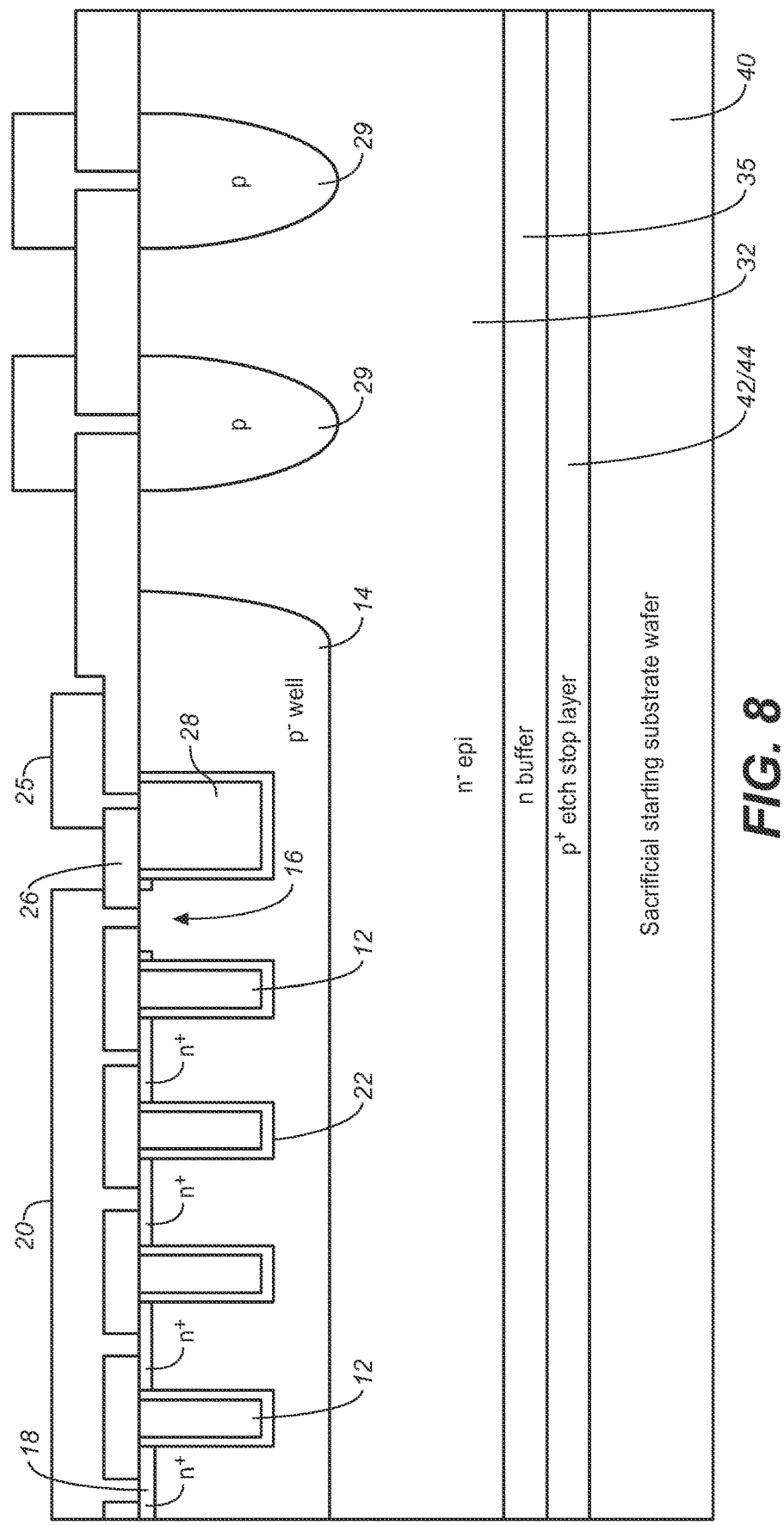
FIG. 8 illustrates a modification of the device of FIG. 1 where the wafer of FIG. 4

FIG. 8 illustrates a modification of the device of FIG. 1 where the wafer 40 of FIG. 4 or FIG. 6, with the etch stop layer 42 or 44 on top, is used as the growth substrate for forming the overlying epitaxial layer and regions. The etch stop layer 42/44 has no effect on the remaining processes used to form the device structure. The n− drift layer 32 and n− buffer layer 35 are epitaxially grown over the etch stop layer 42/44. The device can be a vertical switch device, such as an IGTO, an IGBT, a thyristor, or other device, which may be gated or non-gated.

Figure 9:
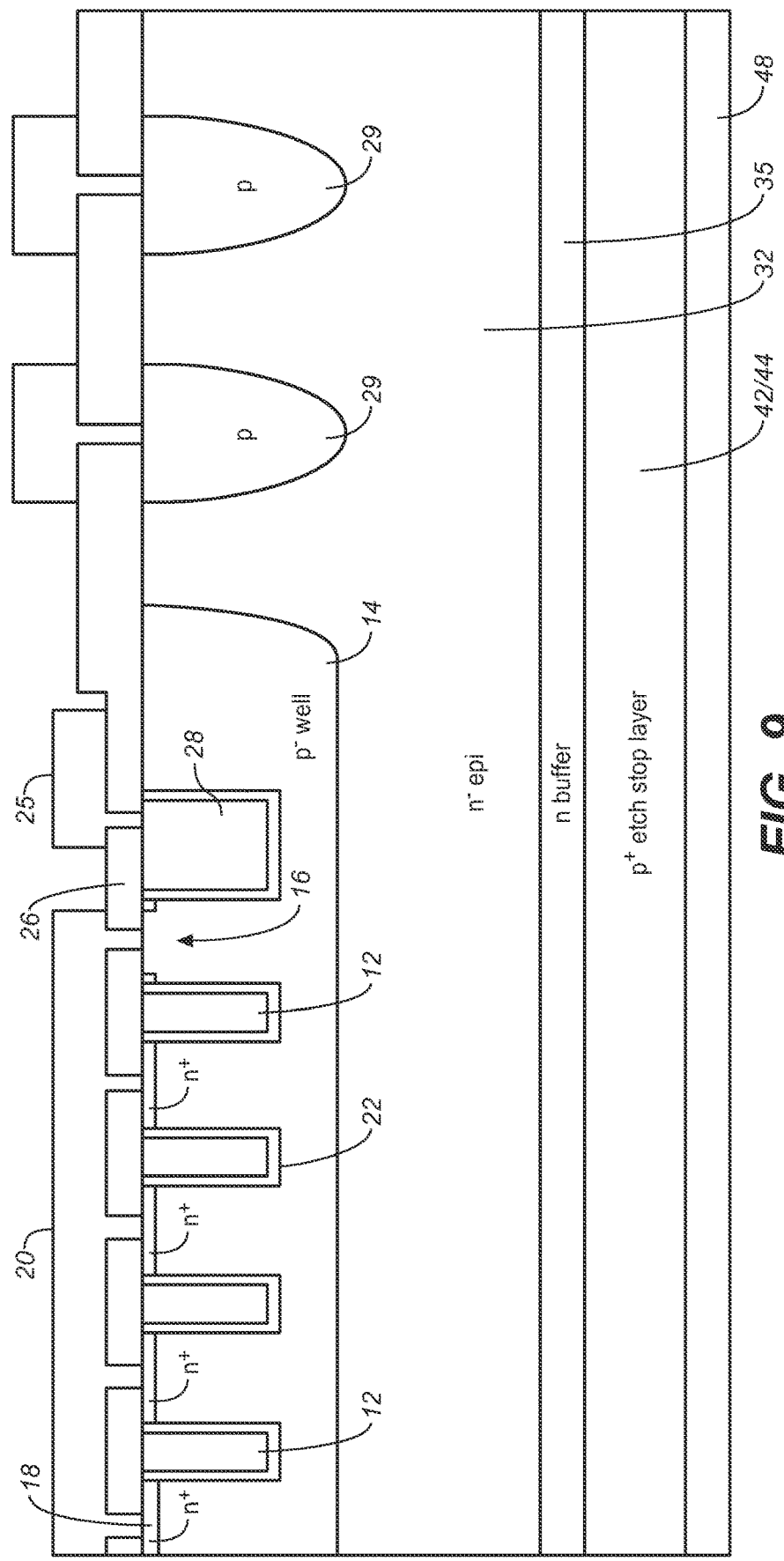
FIG. 9 illustrates the device of FIG. 8 after the wafer portion below the etch stop layer has been removed by grinding and chemical or plasma etching, using the etch stop layer to automatically stop the etching process, followed by forming a bottom metal electrode over the p+ etch stop layer.

FIG. 9 illustrates the device of FIG. 8 after the wafer portion below the etch stop layer 42/44 has been removed by grinding, followed by chemical or plasma etching, using the etch stop layer 42/44 to automatically stop the etching process. Those skilled in the art know various chemical or plasma etching techniques where the etch rate is greatly reduced with highly p− doped silicon or an SiGe layer.

A metal electrode 48 is then formed over the etch stop layer 42/44 to complete the vertical power device.

Figure 10:
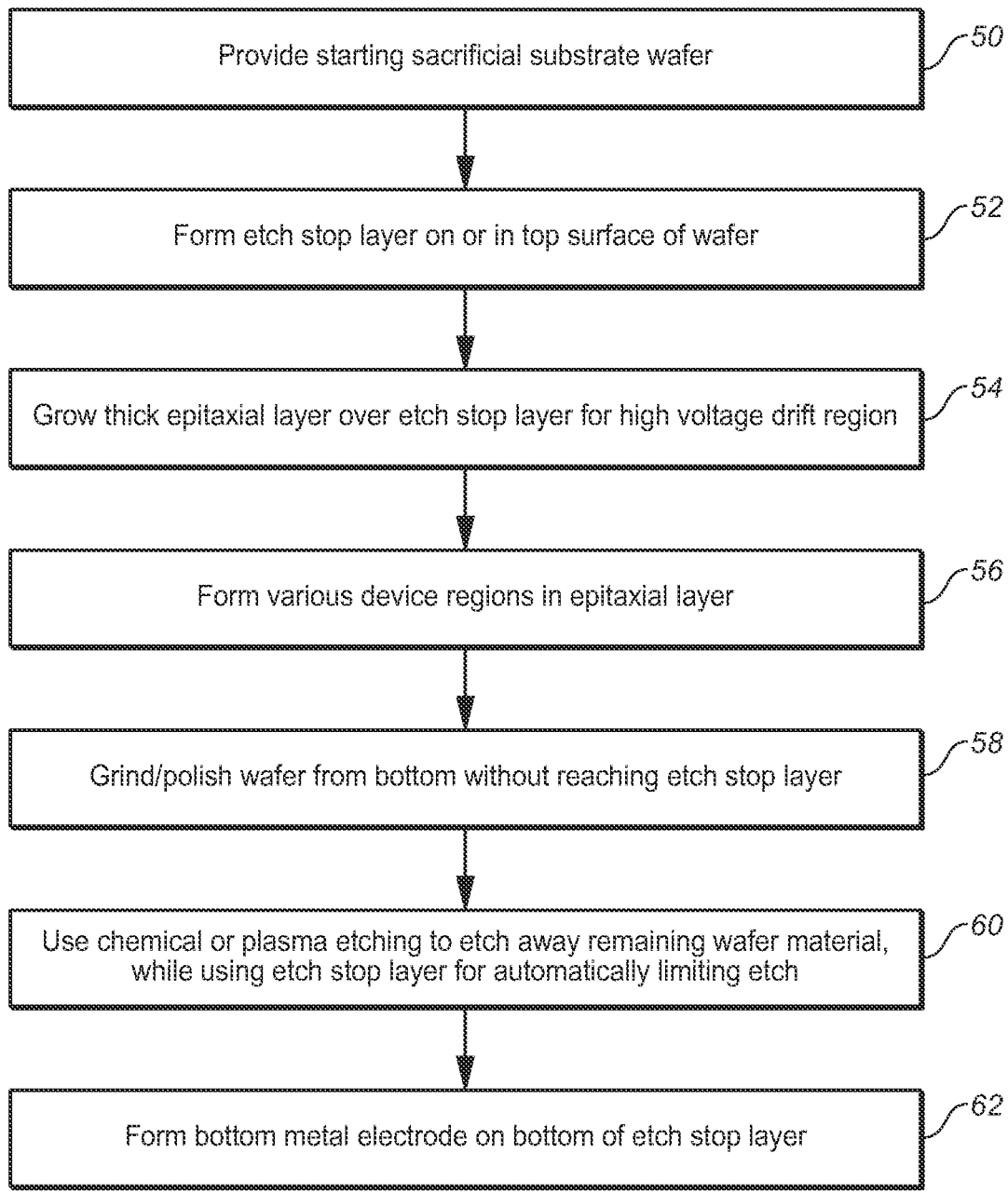
FIG. 10 is a flowchart of steps used in one embodiment of the invention.

FIG. 10 illustrates various steps used in the process to form a vertical power device with a thin, low resistivity p+ layer as its bottom semiconductor layer.

In step 50, a starting wafer is provided. If it is p-doped, the dopant density should be less than $1\times10E18$ cm$^{-3}$.

In step 52, a low resistivity p+ etch stop layer 42/44 is formed on or in the top surface of the wafer.

In step 54, a thick epitaxial layer is formed over the etch stop layer 42/44 to form an n− type drift region for supporting high voltages in the off state of the vertical power device. The drift region may be greater than 10 microns thick.

In step 56, the other device layers and regions are formed, such as to form the IGTO device of FIG. 8.

In step 58, the wafer is ground down to a thickness where the tolerance ensures that the grinding has not reached the etch stop layer 42/44. Minimum post-grinding thicknesses are typically on the order of 0.05 mm (50 microns). So, the wafer will be at least 50 microns thick at this stage.

In step 60, a chemical or plasma etch is used to remove the remainder of the wafer up to the etch stop layer 42/44, which automatically limits the etching process.

In step 62, a bottom metal electrode is formed over the thin p+ etch stop layer 42/44 to complete the vertical power device. A top metal electrode may also be formed at this time or previously. The etch stop layer 42/44 will typically have a p− type dopant concentration greater than $1\times10E19$ cm$^{-3}$ and will efficiently inject holes into the drift layer when the device is turned on. The voltage drop across the etch stop layer 42/44 is low due to its small thickness and its low resistivity. The thickness is highly repeatable from lot-to-lot. In one embodiment, the etch stop layer 42/44 is less than 20 microns, and preferably less than 5 microns. This is much thinner than a minimum, ground down p+ wafer thickness of, for example, 50 microns.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a vertical power device comprising:
   providing a silicon substrate wafer having a top surface and a bottom surface;
   forming a silicon p− type etch stop layer over or in the top surface of the wafer, the etch stop layer having an etch rate, when using a first type of etchant material, lower than the etch rate of the wafer underlying the etch stop layer, wherein the etch rate of the etch stop layer is determined by a p− type dopant concentration in the etch stop layer, the etch stop layer being conductive;
   epitaxially growing a drift layer overlying the etch stop layer;
   forming one or more doped regions in or over the drift layer;
   etching at least a portion of the wafer, using the first type of etchant material, to remove the wafer while retaining the etch stop layer such that the etch stop layer has an exposed surface, the etch stop layer automatically reducing the etch rate; and
   forming a metal electrode on the exposed surface of the etch stop layer, whereby, when the device is turned on and conducting a vertical current, the current flows through the metal electrode and the etch stop layer.

2. The method of claim 1 wherein the wafer is one of n− type, undoped, or a p− type having a p− type dopant concentration less than $1\times10E18$ cm$^{-3}$.

3. The method of claim 1 wherein forming the etch stop layer comprises epitaxially growing a layer having a p− type dopant concentration greater than $1\times10E19$ cm$^{-3}$.

4. The method of claim 1 wherein forming the etch stop layer comprises implanting boron ions into the top surface of the wafer.

5. The method of claim 1 wherein etching the wafer comprises performing a chemical etch of the wafer.

6. The method of claim 5 wherein the chemical etch comprises applying a KOH solution or a TMAH solution to an exposed surface of the wafer until the etch stop layer is exposed.

7. The method of claim 1 wherein etching the wafer comprises performing a plasma etch of the wafer until the etch stop layer is exposed.

8. The method of claim 1 further comprising grinding down the wafer to a certain thickness, followed by the step of etching.

9. The method of claim 1 further comprising epitaxially growing an n− type buffer layer over the etch stop layer, followed by the step of epitaxially growing the drift layer over the n− type buffer layer, wherein the drift layer is n− type.

10. The method of claim 9 wherein the drift layer is n− type, and the step of forming one or more doped regions in or over the drift layer comprises:

forming a p– type well region in the drift layer; and
forming one or more n– type regions in the p– type well region.

11. The method of claim 1 wherein the metal electrode is a bottom metal electrode, the method further comprising forming a top metal electrode overlying the one or more doped regions in or over the drift layer, such that current is conducted between the top metal electrode and the bottom metal electrode through the etch stop layer when the device is turned on.

12. The method of claim 1 further comprising forming trenches containing a conductor to form gates, such that biasing the gates turns the device on to conduct a current through the etch stop layer.

* * * * *